(12) United States Patent
Wang et al.

(10) Patent No.: US 12,625,676 B2
(45) Date of Patent: May 12, 2026

(54) MEMORY DEVICE AND OPERATING METHOD THEREOF

(71) Applicant: MACRONIX INTERNATIONAL CO., LTD., Hsinchu (TW)

(72) Inventors: Wei-Chen Wang, Taipei City (TW); Han-Wen Hu, Tainan City (TW); Yung-Chun Li, New Taipei City (TW); Huai-Mu Wang, New Taipei City (TW); Chien-Chung Ho, Chiayi County (TW); Yuan-Hao Chang, Taipei City (TW); Tei-Wei Kuo, Taipei City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 1015 days.

(21) Appl. No.: 17/830,453

(22) Filed: Jun. 2, 2022

(65) Prior Publication Data

US 2023/0221956 A1    Jul. 13, 2023

Related U.S. Application Data

(60) Provisional application No. 63/298,614, filed on Jan. 11, 2022.

(51) Int. Cl.
G06F 7/544 (2006.01)
G06F 9/30 (2018.01)
(Continued)

(52) U.S. Cl.
CPC .......... G06F 7/5443 (2013.01); G06F 9/3001 (2013.01); G06F 9/30036 (2013.01);
(Continued)

(58) Field of Classification Search
CPC .. G06F 7/5443; G06F 9/3001; G06F 9/30036; G06N 3/063; G06N 20/00; G11C 7/1006; G11V 11/54; G11V 11/5642
See application file for complete search history.

(56) References Cited

U.S. PATENT DOCUMENTS 4,862,167 A * 8/1989 Copeland, III ......... H03M 7/42
                                                341/107
8,971,112 B2 * 3/2015 Crippa ................ G11C 11/5628
                                                365/185.24
(Continued)

OTHER PUBLICATIONS

Y. Sun et al., "Unary Coding and Variation-Aware Optimal Mapping Scheme for Reliable ReRAM-Based Neuromorphic Computing," in IEEE Transactions on Computer-Aided Design of Integrated Circuits and Systems, vol. 40, No. 12, pp. 2495-2507, Dec. 2021, doi: 10.1109/TCAD.2021.3051856. (Year: 2021).*
(Continued)

*Primary Examiner* — Andrew Caldwell
*Assistant Examiner* — Kenny K. Bui
(74) *Attorney, Agent, or Firm* — McClure, Qualey & Rodack, LLP

(57) ABSTRACT

A memory device, includes a memory array for storing a plurality of vector data each of which has an MSB vector and a LSB vector. The memory array includes a plurality of memory units each of which has a first bit and a second bit. The first bit is used to store the MSB vector of each vector data, the second bit is used to store the LSB vector of each vector data. Each vector data is executed with a multiplying-operation, the MSB vector and the LSB vector of each vector data is executed with a first group-counting operation and a second group-counting operation respectively. The threshold voltage distribution of each memory unit is divided into N states, where N is a positive integer and N is
(Continued)

less than 2 to the power of 2, the effective bit number stored by each memory unit is less than 2.

15 Claims, 13 Drawing Sheets

(51) Int. Cl.

| | |
|---|---|
| *G06N 3/063* | (2023.01) |
| *G06N 20/00* | (2019.01) |
| *G11C 7/10* | (2006.01) |
| *G11C 11/54* | (2006.01) |
| *G11C 11/56* | (2006.01) |

(52) U.S. Cl.
CPC .............. *G06N 3/063* (2013.01); *G06N 20/00* (2019.01); *G11C 7/1006* (2013.01); *G11C 11/54* (2013.01); *G11C 11/5642* (2013.01); *Y02D 10/00* (2018.01)

(56) References Cited

U.S. PATENT DOCUMENTS

| | | | | |
|---|---|---|---|---|
| 2008/0062763 | A1* | 3/2008 | Park ................... | G11C 16/0408 |
| | | | | 365/185.11 |
| 2012/0314500 | A1* | 12/2012 | Song ...................... | G11C 16/34 |
| | | | | 365/185.12 |
| 2015/0078079 | A1 | 3/2015 | D'Abreu | |
| 2019/0043560 | A1* | 2/2019 | Sumbul ................... | G06N 3/08 |
| 2019/0057727 | A1* | 2/2019 | Mathuriya ............... | G11C 5/04 |
| 2019/0171634 | A1* | 6/2019 | Nowakiewicz ....... | G06F 16/221 |
| 2019/0348124 | A1* | 11/2019 | Kim ...................... | G11C 29/52 |
| 2021/0072986 | A1* | 3/2021 | Yudanov ............. | G11C 7/1006 |
| 2021/0382693 | A1 | 12/2021 | Song | |

OTHER PUBLICATIONS

MathWorks, "Number of group elements—MATLAB groupcounts", <https://web.archive.org/web/20191112070643/https://www.mathworks.com/help/matlab/ref/double.groupcounts.html#mw_11d521e8-9d58-4f3d-b475-abff82bd0179>, (Year: 2019).*

* cited by examiner

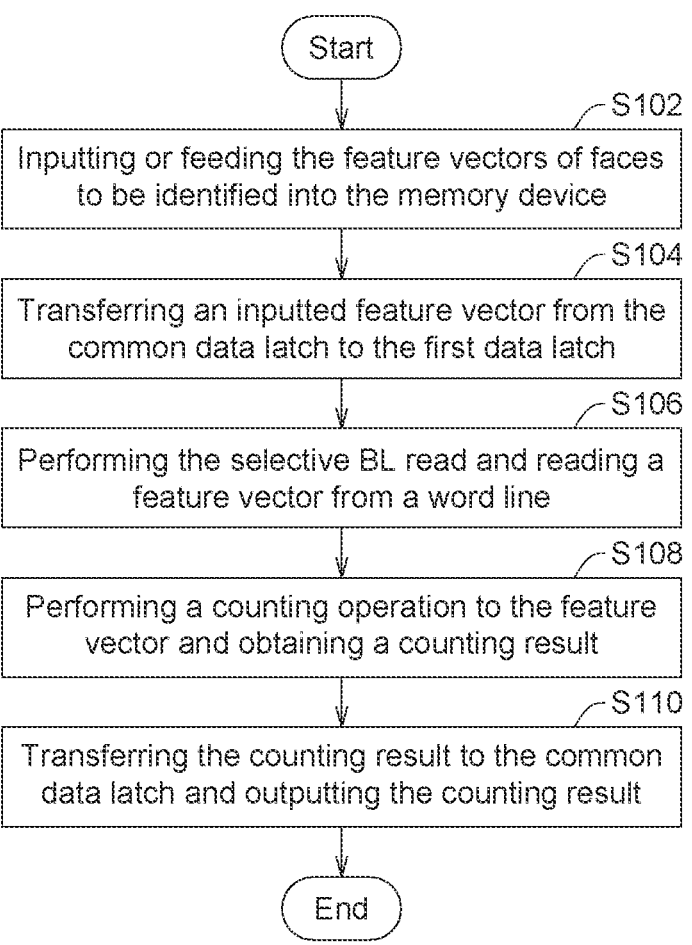

Start

S102

Inputting or feeding the feature vectors of faces to be identified into the memory device

S104

Transferring an inputted feature vector from the common data latch to the first data latch

S106

Performing the selective BL read and reading a feature vector from a word line

S108

Performing a counting operation to the feature vector and obtaining a counting result

S110

Transferring the counting result to the common data latch and outputting the counting result End

FIG. 1B

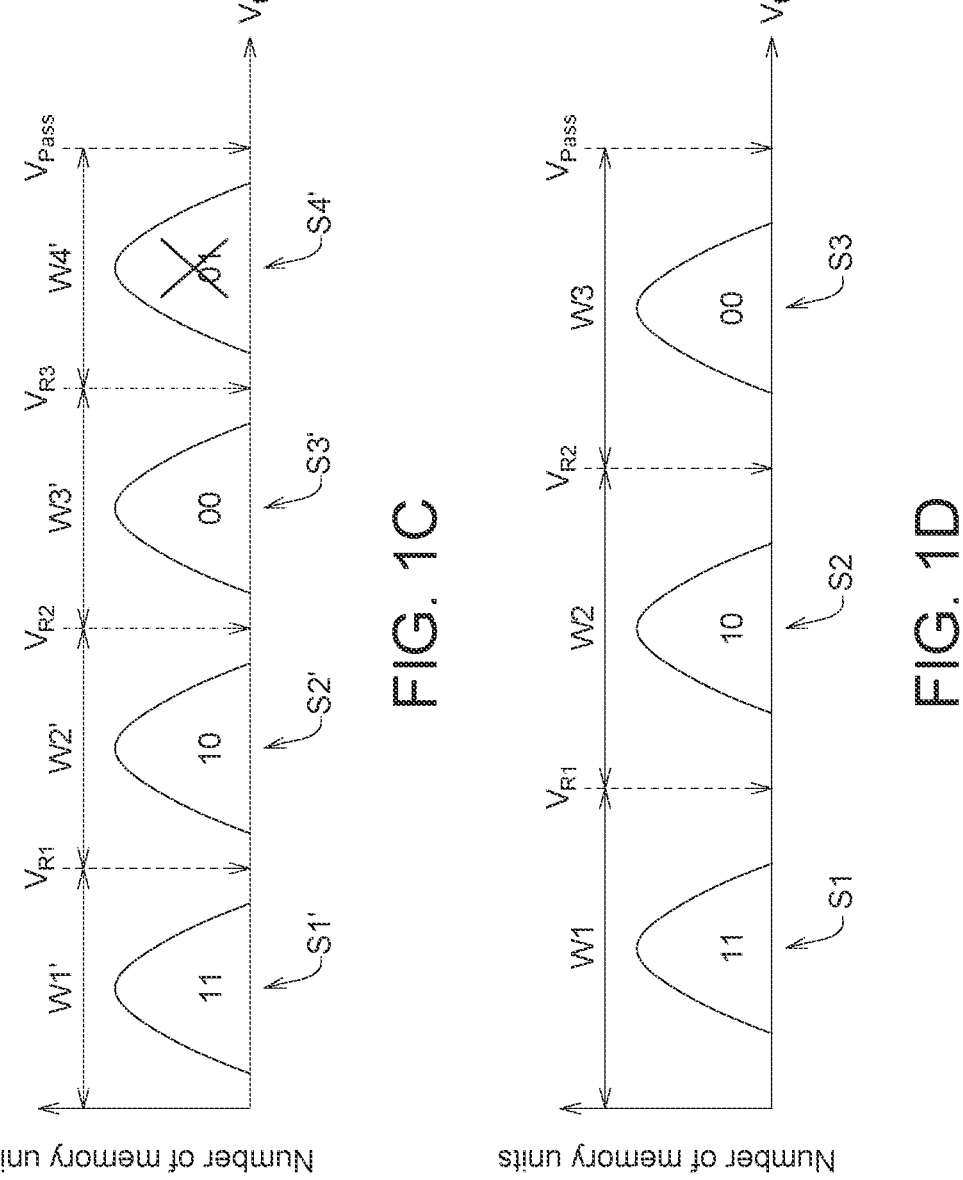

16KB,550μs

2KB,68μs

34μs

16bit

68μs

8bit

136μs

4bit

MEMORY DEVICE AND OPERATING METHOD THEREOF

This application claims the benefit of U.S. provisional application Ser. No. 63/298,614, filed Jan. 11, 2022, the subject matter of which is incorporated herein by reference.

TECHNICAL FIELD

The present disclosure relates to a semiconductor device and an operating method thereof, and more particularly, to a memory device and an in-memory computation method.

BACKGROUND

With the rapid development of artificial intelligence (AI) algorithms, researchers seek hardware devices suitable for executing AI algorithms. Semiconductor memory devices, such as NAND-type memory arrays, may perform AI computations through in-memory computation (IMC). When performing a multiply-and-accumulate (MAC) operation commonly used in AI, each memory unit of the memory array may output current to the bit line according to a result of multiplying-operation, and accumulate currents on the same bit line to generate a result of accumulating-operation. In a memory array, performing the MAC-operation in an analog manner may achieve a faster computation speed. However, overlaps of the current distribution may lead to misjudgment of the computation result, thereby reducing computation accuracy.

Furthermore, when the computation data has a larger number of bits, accumulating the bits one by one will consume more computation resource and computation time. Moreover, performing several times of bit line setups will also consume several of setup-time and reduce computation speed.

In addition, when the memory array uses multi-level cells (MLC) to store data, threshold voltage distribution of the memory units may have a larger number of states, which will lead to narrowing of the voltage intervals for the reading-voltage, and error in the reading-operation may be caused.

In view of the above-mentioned technical problem, those skilled of the related industries in the technical field are devoted to improve storing mechanism of memory units and operating method of IMC, so as to enhance computation accuracy and computation speed.

SUMMARY

Technical solutions of the present disclosure provide executing digital MAC-operation by memory array, reducing the number of states of threshold voltage distribution of memory units and employing pipelined computation schedule and majority group-counting, so as to enhance computation accuracy and computation speed.

According to an aspect of the present disclosure, a memory device is provided, the memory device comprises a memory array for storing a plurality of vector data, each vector data has an MSB vector and a LSB vector. The memory array comprises a plurality of memory units, each memory unit has a first bit and a second bit, the first bit is used to store the MSB vector of each vector data, and the second bit is used to store the LSB vector of each vector data. Each vector data is executed with a multiplying-operation, the MSB vector of each vector data is executed with a first group-counting operation, the LSB vector of each vector data is executed with a second group-counting operation, and the threshold voltage distribution of each memory unit is divided into N states, N is a positive integer and N is less than 2 to the power of 2, and the effective bit number stored by each memory unit is less than 2.

According to another aspect of the present disclosure, an operating method of a memory device is provided, wherein the memory device includes a memory array, the memory array includes a plurality of memory units, each memory unit has a first bit and a second bit, the operating method comprises the following steps. Storing a plurality of vector data in the memory array, each vector data has an MSB vector and a LSB vector. Storing the MSB vector of each vector data in the first bit. Storing the LSB vector of each vector data in the second bit. Executing a multiplying-operation for each vector data. Executing a first group-counting operation for the MSB vector of each vector data. Executing a second group-counting operation for the LSB vector of each vector data. The threshold voltage distribution of each memory unit is divided into N states, N is a positive integer and N is less than 2 to the power of 2, and the effective bit number stored by each memory unit is less than 2.

BRIEF DESCRIPTION OF THE DRAWINGS

FIG. 1B is a flowchart of the MAC-operation performed by the memory device of the present disclosure.

FIG. 1C is a schematic diagram illustrating states of threshold voltage distribution of a normal 2-bit MLC memory unit.

FIG. 1D is a schematic diagram illustrating states of threshold voltage distribution of a 1.5-bit MLC memory unit according to an embodiment of the present disclosure.

Figure 1A:
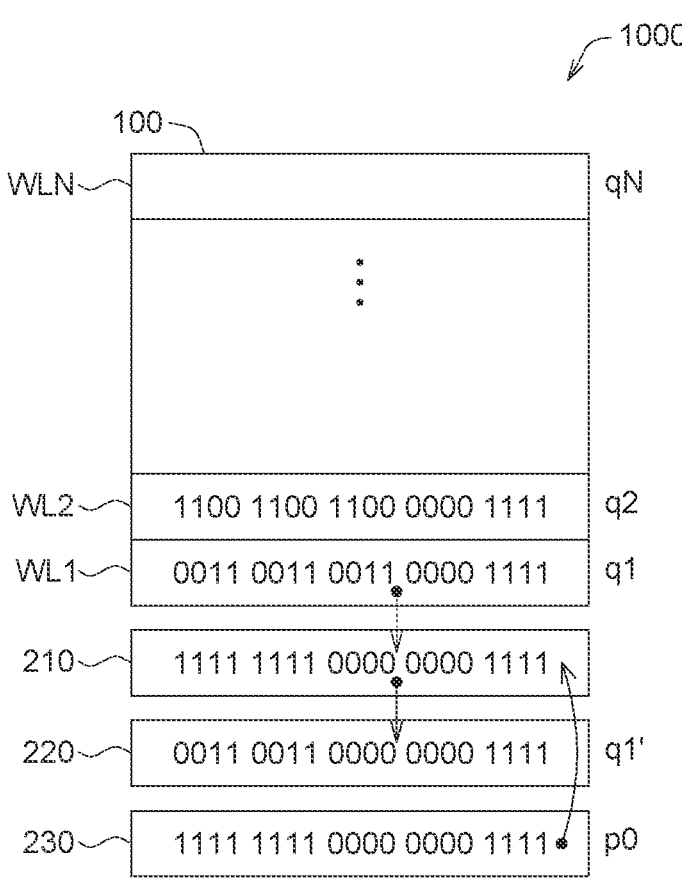
FIG. 1A is a schematic diagram of a memory device according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIG. 1A is a schematic diagram of a memory device 1000 according to an embodiment of the present disclosure. Referring to FIG. 1A, the memory device 1000 includes a memory array 100 and a plurality of data latches 210, 220 and 230. The memory device 1000 may be used to perform in-memory computation (IMC), such as multiply-and-accumulate (MAC) operations. More specifically, the memory device 1000 of the present disclosure is used to perform digital MAC-operations to improve computation accuracy. The data latch 210 may be referred to as a "first data latch", and the data latch 220 may be referred to as a "second data latch". In addition, the data latch 230 may be referred to as a "common data latch (CDL)", which may serve as an input/output interface of the memory device 1000.

The memory array 100 includes a plurality of word lines WL1-WLN, each of the word lines WL1-WLN may store a vector data. When the memory device 1000 is used to perform a MAC-operation of face recognition algorithm, the feature vectors q1-qN of N faces F1-FN may be pre-stored in the word lines WL1-WLN of the memory array 100. For example, the feature vector q1 of the first face F1 is a 20-bit binary data "00110011001100001111" which is stored in the word line WL1, and the feature vector q2 of the second face F2 is a 20-bit data "11001100110000001111" which is stored in the word line WL2, and so on.

Moreover, each of the memory units (or memory units) in the memory array 100 of the present disclosure is 1.5-bit multi-level cell (MLC). Compared with the normal 2-bit MLC memory unit (hereinafter referred to as "2-bit MLC"), the 1.5-bit MLC memory unit (hereinafter referred to as "1.5-bit MLC") of the present disclosure stores a less amount of data, and the equivalent number of bits is 1.5 bits. The mechanism of the 1.5-bit MLC will be described in detail later.

The data latch 230 (i.e., the common data latch (CDL)) may temporarily store vector data inputted from the memory device 1000 externally. When performing face recognition or face search, the feature vector p0 of the face F0 to be recognized may be externally inputted to the memory device 1000 and temporarily stored in the data latch 230. The feature vector p0 is, for example, a data of 20 bits "11111111000000001111". Then, the feature vector p0 is transferred from the data latch 230 to the data latch 210.

A "selective bit line (BL) read" operation may be performed in the memory array 100 to read the feature vectors q1-qN from the word lines WL1-WLN respectively, and the selective BL read operation may have a function of multiplying-operation. The feature vector p0 to be identified may be referred to as "input feature vector p0", and the pre-stored feature vectors q1-qN may be referred to as "weight feature vector qi", where i=1-N. The selective BL read operation may achieve the multiplying-operation of the input feature vector p0 and the weight feature vector qi. When a bit of the feature vector p0 and the corresponding bit of the feature vector qi are both "1", the selective BL read operation may read the bit of the feature vector qi as "1". When a bit of the feature vector p0 is "0" or the corresponding bit of the feature vector qi is "0", selective BL read operation may read the bit of the feature vector qi as "0". Accordingly, the output result qi'=p0*qi obtained by the selective BL read operation. The output result qi' may be referred to as "output feature vector qi'". For example, the feature vector p0 is "11111111000000001111", the feature vector q1 of the first face F1 is "00110011001100001111", and the output feature vector q1' obtained by the selective BL read operation is "00110011000000001111". Then, the output feature vector q1' may be written into the data latch 220.

Then, an accumulating-operation may be performed on the output feature vector q1' which is temporarily stored in the data latch 220, so as to accumulate the bits of "1" in the output feature vector q1'. In one example of the accumulating-operation, the memory device 1000 may execute a fail-bit-count instruction to perform a counting-operation on the output feature vector q1'. Taking the output feature vector q1'="00110011000000001111" as an example, the 8 bits of B0-B3, B12, B13, B16 and B17 are "1", and the counting result C1 of the output feature vector q1' is a decimal "8", and the counting result C1 is the MAC-operation result MAC1 of the feature vector p0 and the feature vector q1. Then, the counting result C1 may be transferred to the data latch 230, and the counting result C1 may be outputted to the exterior of the memory device 1000.

In the face recognition algorithm, the similarity between the pre-stored face F1 and the face FQ to be recognized may be represented as the inner product "∥q1∥∥p0∥cos θ" of the feature vector p0 and the feature vector q1. When the similarity between the face F1 and the face F0 is higher, the angle "θ" is closer to zero, and the inner product of the feature vector p0 and the feature vector q1 is close to "∥q1∥∥p0∥". Therefore, the similarity between the face F1 and the face FQ to be recognized may be estimated according to the MAC-operation result MAC1 of the feature vector p0 and the feature vector q1.

FIG. 1B is a flowchart of the MAC-operation performed by the memory device 1000 of the present disclosure. Referring to FIG. 1B (and considering the memory device 1000 of FIG. 1A), in step S102, the feature vector p0 of the face FQ to be recognized is inputted or fed into the memory device 1000. The feature vector p0 may be temporarily stored in the data latch 230.

Then, in step S104, the feature vector p0 is transferred from the data latch 230 (i.e., the common data latch (CDL)) to the data latch 210 (i.e., the first data latch). Then, in step S106, a selective BL read operation is performed, so as to read the feature vectors q1-qN from the word lines WL1-WLN of the memory array 100 respectively and perform a multiplying-operation thereon. The output feature vectors q1'-qN' obtained by the selective BL read operation are products of the feature vectors q1-qN and the feature vector p0. The output feature vectors q1'-qN' may be temporarily stored in the data latch 220 in sequence.

Then, in step S108, a counting-operation is performed on the output feature vectors q1'-qN' temporarily stored in the data latch 220 respectively, so as to obtain a counting result C1. Then, in step S110, the counting result C1 may be transferred to the data latch 230, and the counting result C1 may be outputted through the data latch 230.

FIG. 1C is a schematic diagram illustrating states of threshold voltage distribution of a normal 2-bit MLC memory unit. FIG. 1D is a schematic diagram illustrating states of threshold voltage distribution of a 1.5-bit MLC memory unit according to an embodiment of the present disclosure, which describes mechanism of the 1.5-bit MLC. A physical page of the memory array 100 may include a plurality of logical pages, such as high page and low page. High page corresponds to the first bit CB1 of the MLC memory unit, and low page corresponds to the second bit CB2 of the MLC memory unit. Each 8 bits of the feature vector of a face may be divided into an MSB (most significant bit) vector and a LSB (least significant bit) vector.

Please refer to FIG. 1C first, the threshold voltage Vt of the memory unit may be programmed as different voltage levels, and a normal 2-bit MLC may have 4 states S1'-S4' according to the distribution of the programmed threshold voltage Vt. The number of "4" for states S1'-S4' is equal to 2 to the power of 2. The state S1' is between 0 v (zero potential) and the reading voltage $V_{R1}$, the state S2' is between the reading voltage $V_{R1}$ and the reading voltage $V_{R1}$, and the state S3' is between the reading voltage $V_{R2}$ and the reading voltage $V_{R3}$, the state S4' is between the reading voltage $V_{R3}$ and the pass voltage $V_{Pass}$. Normal 2-bit MLC may store 2-bit data (CB1, CB2). State S1' corresponds to data (CB1=1, CB2=1), the state S2' corresponds to data (CB1=1, CB2=0), the state S3' corresponds to data (CB1=0, CB2=0), the state S4' corresponds to data (CB1=0, CB2=1). The voltage intervals W1'-W4' corresponding to the states S1'-S4' of the normal 2-bit MLC are narrower, which may lead to reading errors of the data (CB1, CB2), thereby degrading accuracy of the in-memory computation (such as MAC-operation).

Please refer to FIG. 1D, for the 1.5-bit MLC of the present disclosure, distribution of the threshold voltage Vt is only divided into N states, where N is less than 2 to the power of 2. For example, N=3, and the 1.5-bit MLC has 3 states S1-S3. The state S1 is between 0 v (zero potential) and the reading voltage $V_{R1}$, the state S2 is between the reading voltage $V_{R1}$ and the reading voltage $V_{R2}$, and the state S3 is between the reading voltage $V_{R2}$ and the pass voltage $V_{Pass}$. The equivalent number of bits of data that may be stored in a 1.5-bit MLC is 1.5 bits. State S1 corresponds to data (CB1=1, CB2=1), the state S2 corresponds to data (CB1=1, CB2=0), and the state S3 corresponds to the data (CB1=0, CB2=0). In other words, the 1.5-bit MLC does not include data (CB1=0, CB2=1), and the states S3' and S4' of the normal 2-bit MLC may be regarded as a single state S3 of the 1.5-bit MLC. The voltage intervals W1-W3 corresponding to the states S1-S3 of the 1.5-bit MLC is larger than the voltage intervals W1'-W4' of the normal 2-bit MLC. Therefore, reading accuracy of the data (CB1, CB2) of the 1.5-bit MLC may be enhanced.

Table 1 shows an example of contents of the first bit CB1 and the second bit CB2, which may show the difference between the data (CB1, CB2) of the 1.5-bit MLC and the normal 2-bit MLC.

TABLE 1

| Normal 2-bit MLC | |
|---|---|
| High page | The first bit CB1 10010100 |
| Low page | The second bit CB2 01011011 |
| 1.5-bit MLC | |
| High page | The first bit CB1 10010100 |
| Low page | The second bit CB2 00010000 |

FIGS. 2A to 2E are schematic diagrams of various embodiments of counting-operations performed by the memory device 1000 of the present disclosure. In one example, when the features of the faces F0 and F1-FN have 512 parameters, each of the feature vector p0, the feature vectors q1-qN and the output feature vectors q1'-qN' has a data amount of 16 KB. Taking the counting-operation of the feature vector q1' of 16 KB as an example, the counting-operation is performed by the "full page counting" operation shown in FIG. 2A, the "small frame counting" operation shown in FIG. 2B or the "group-counting" operation shown in FIGS. 2C, 2D, and 2E.

Figures 2A, 2B, 2C, 2D, 2E:
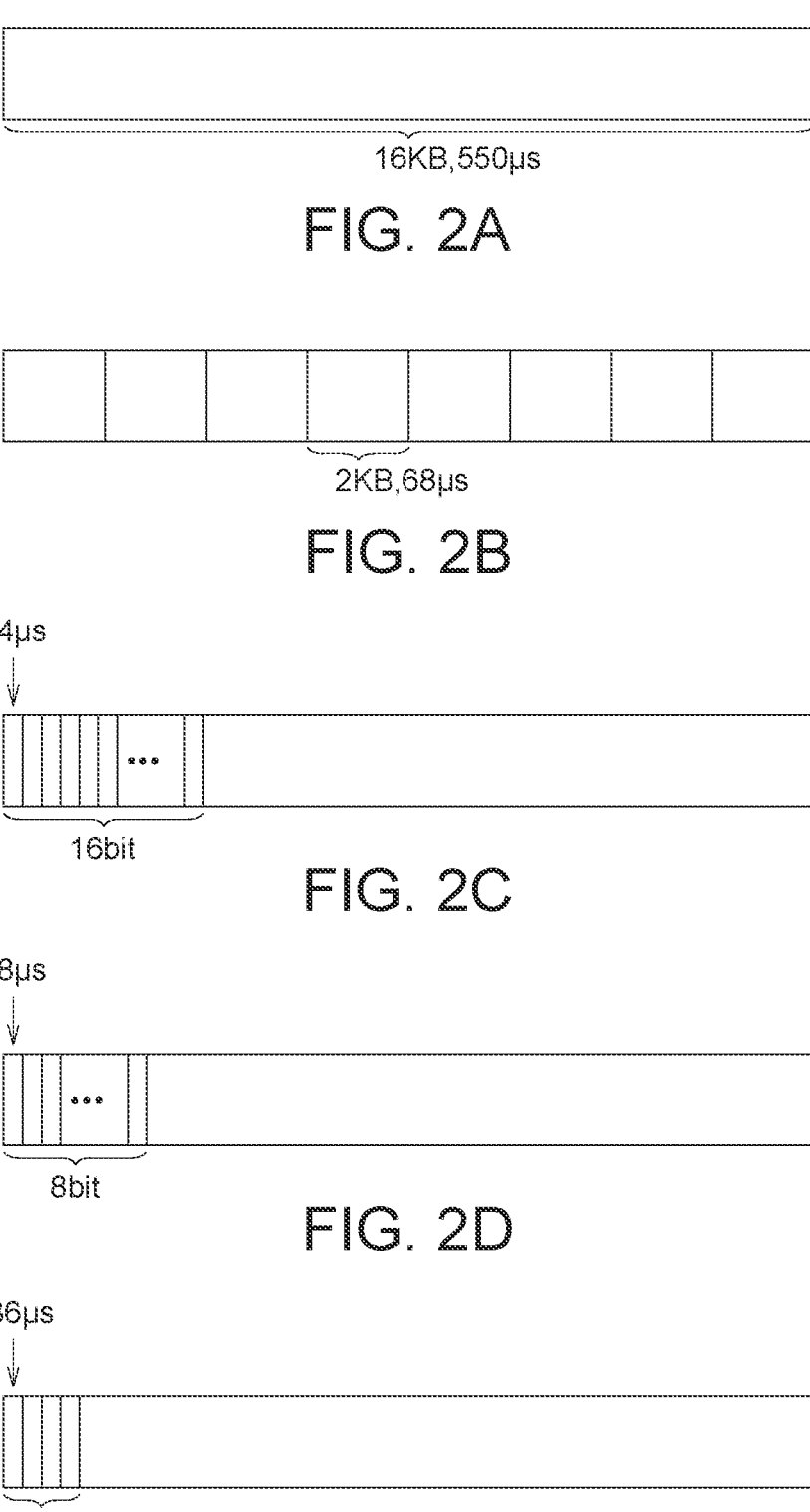
FIGS. 2A to 2E are schematic diagrams of various embodiments of counting-operations performed by the memory device of the present disclosure.

As shown in FIG. 2A, the "full page counting" operation of the feature vector q1' refers to count the entire data amount of 16 KB of the feature vector q1', and to calculate the total number of bits of "1". The time for counting-operation of data amount of 16 KB is approximately 550 us. Furthermore, as shown in FIG. 2B, the "small frame counting" operation of the feature vector q1' refers to divide the feature vector q1' into a plurality of small frames and count them respectively. For example, dividing into 8 small frames with a data amount of 2 KB, and the time for counting-operation of each small frame is approximately 68 us (i.e., 550 us/8).

On the other hand, as shown in FIG. 2C, the group-counting operation of the feature vector q1' refers to group the feature vector q1' into a plurality of groups and count them respectively. For example, after the feature vector q1' is grouped, each group has 16 bits. When there is a bit of "1", if any, in the 16 bits of a single group, the group-counting result GC=1. When there is no bit of "1" in these 16 bits, the group-counting result GC=0. The operation time of the group-counting of 16 bits is approximately 34 us (i.e., 550 us/16).

Furthermore, the examples of FIGS. 2D and 2E refer to group the feature vector q1' into groups of different numbers of bits. In the example of FIG. 2D, each group of the feature vector q1' has 8 bits, and the operation time of group-counting is approximately 68 us (i.e., 550 us/8). In the example of FIG. 2E, each group of the feature vector q1' has 4 bits, and the operation time of group-counting is approximately 136 us (i.e., 550 us/4).

Figure 3:
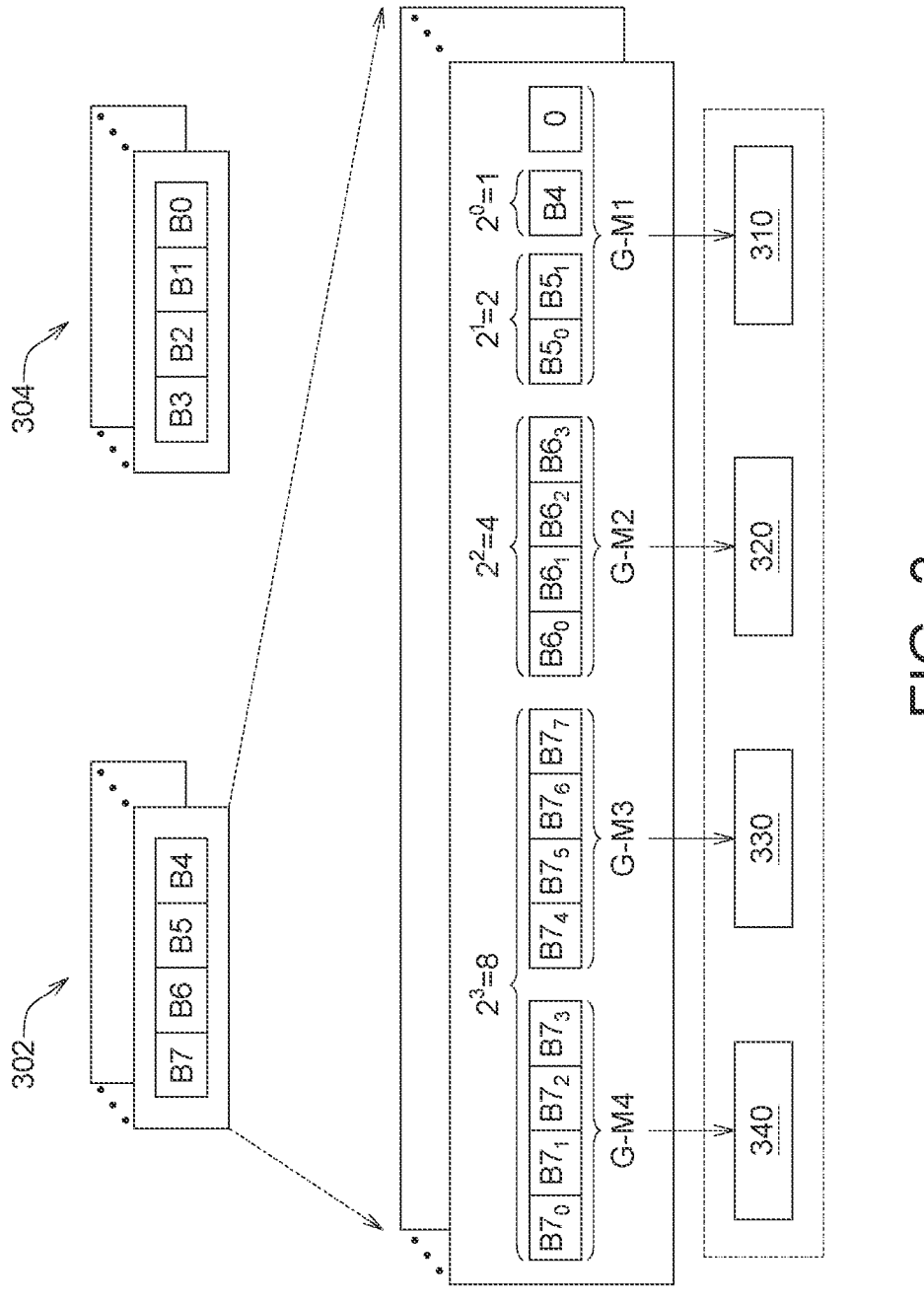
FIG. 3 is a schematic diagram of an embodiment of a group-counting operation performed by the memory device of the present disclosure.

FIG. 3 is a schematic diagram of an embodiment of a group-counting operation performed by the memory device 1000 of the present disclosure. The group-counting operation in this embodiment may correspond to the 4-bit group-counting operation in FIG. 2E. Referring to FIG. 3, each 8 bits of the feature vector q1, the feature vector p0 or the feature vector q1' may be divided into MSB vectors and LSB vectors. For example, MSB vector 302 has 4 bits B4, B5, B6 and B7. LSB vector 304 has 4 bits B0, B1, B2 and B3. The group-counting operation in this embodiment may be referred to as the "first group-counting operation", and may apply to the MSB vector 302 with high importance of data and stored in the high page of the memory array 100 (the group-counting operation executed on the LSB vector 304 may be referred to as the "second group-counting operation").

Value unfolding is performed to the 4 bits B4-B7 with binary format of the MSB vector 302 to obtain the bits with unary format. The bit B4 is expanded (repeated) by only $2^0$ time (i.e., one time) and remains as bit B4, and the bit B5 is expanded by $2^1$ times to form 2 bits B5$_0$ and B5$_1$. The bit B6 is expanded by $2^2$ times to form 4 bits B6$_0$, B6$_1$, B6$_2$ and B6$_3$. The bit B7 is expanded by $2^3$ times to form 8 bits B7$_0$, B7$_1$, B7$_2$, B7$_3$, B7$_4$, B7$_5$, B7$_6$ and B7$_7$. In addition, the expanded bits with unary format are grouped into a plurality of groups G-M1, G-M2, G-M3 and G-M4. Each group has 4 bits. Group G-M1 includes B5$_0$, B5$_1$, B4 and a dummy bit "0". Group G-M2 includes $B6_0$, $B6_1$, $B6_2$ and $B6_3$. Group G-M3 includes $B7_4$, $B7_5$, $B7_6$ and $B7_7$. Group G-M4 includes $B7_0$, $B7_1$, $B7_2$ and $B7_3$.

The first group-counting operations 310-340 may be performed for the groups G-M1 to G-M4 according to the first data amount D1 respectively. The MSB vector 302 has high importance of data and stored in the high page, hence the first data amount D1 is a "fine-grained" smaller number of bits with which the first group-counting operations 310-340 are performed. For example, the first data amount D1 is 4 bits.

In this embodiment, the first group-counting operations 310-340 may be performed based on a majority function. As shown in Table 2, when each of the groups G-M1 to G-M4 has three or more (i.e., majority) "1" bits, out of 4 bits, the majority group-counting result MGC=1. When each of the groups G-M1 to G-M4 has one or less (i.e., minority) "1" bits, out of 4 bits, the majority group-counting result MGC=0. When there are two (i.e., half) "1" bits out of 4 bits, an ideal majority group-counting result MGC=1, and a non-ideal majority group-counting result MGC=0. The majority group-counting operation may tolerate failed bits in a single group, so as to reduce the effect of failed bits in the MSB vector 302.

TABLE 2

| the 4 bits of each group G-M1~G-M4 | Majority group-counting result MGC |
|---|---|
| 1 1 1 1 | 1 |
| 1 1 1 0 | 1 |
| 1 1 0 0 | 1/0 |
| 1 0 0 0 | 0 |
| 0 0 0 0 | 0 |

The normal group-counting result GC and majority group-counting result MGC obtained according to the first data amount D1=4 bits, are shown in the truth table of Table 3. In the normal group-counting operation (without the majority function), when there is a "1" bit out of the 4 bits in a single group, the group-counting result GC=1.

TABLE 3

| the 4 bits of each group G-M1~G-M4 | Number of "1" bit in the 4 bits | normal group-counting result GC | Majority group-counting result MGC |
|---|---|---|---|
| 1 1 1 1 | 4 | 1 | 1 |
| 1 1 1 0 | 3 | | |
| 1 1 0 0 | 2 | | 1/0 |
| 1 0 0 0 | 1 | | 0 |
| 0 0 0 0 | 0 | 0 | |

Figure 4A:
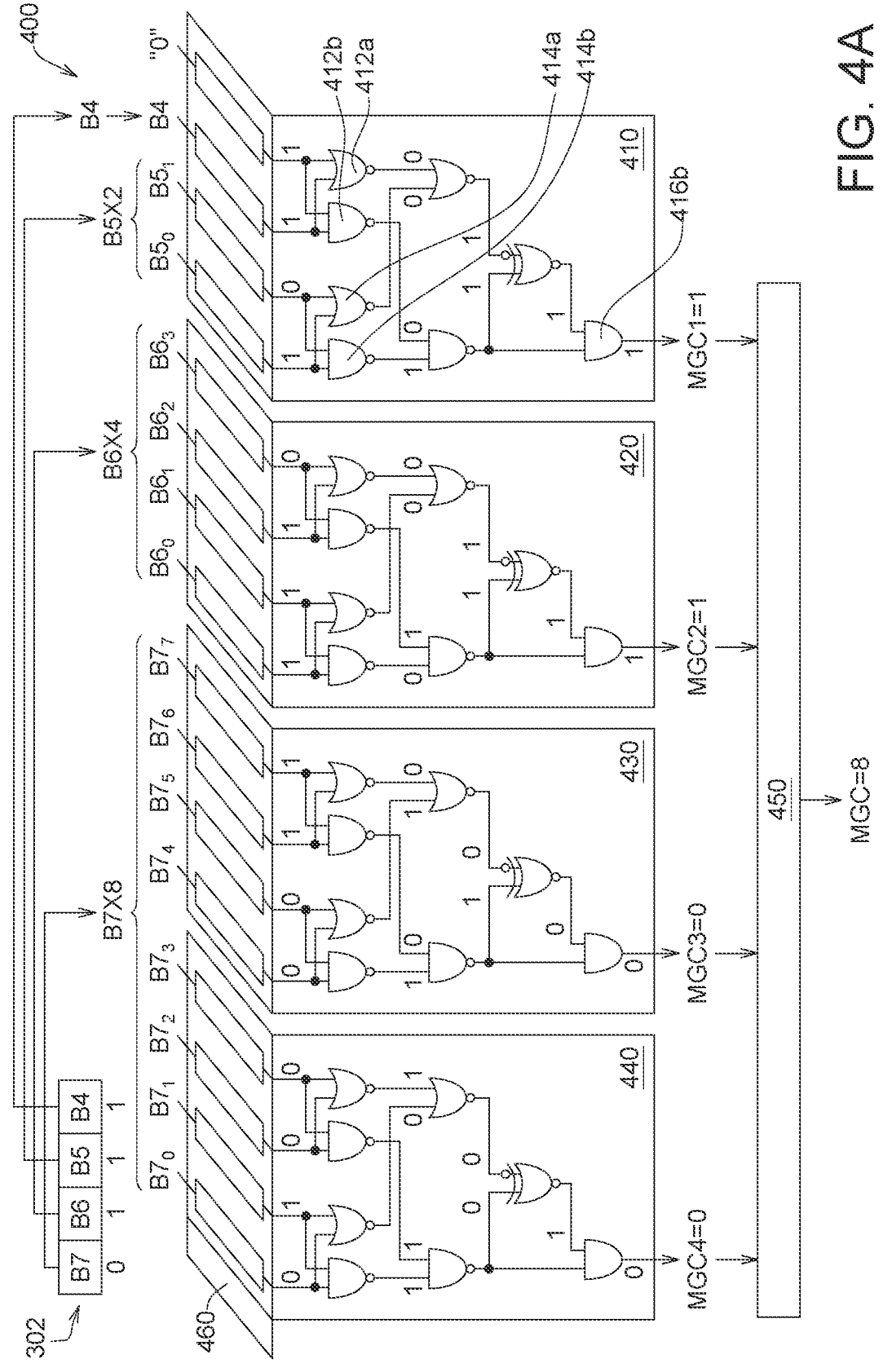
FIG. 4A is a circuit diagram of the counting circuit of the present disclosure.

The above-mentioned majority group-counting operation of the MSB vector 302 may be implemented by a counting instruction of the memory device 1000, and may also be implemented by a counting circuit. Referring to FIG. 4A illustrating a circuit diagram of the counting circuit 400 of the present disclosure, the counting circuit 400 includes a plurality of logic circuits 410-440 and an accumulator 450. Each of the logic circuits 410-440 is used to perform a 4-bit majority group-counting operation.

First, expanding the bits B7, B6, B5 and B4 with the binary format of the MSB vector 302 into the bits $B7_0$, $B7_1$, $B7_2$, $B7_3$, $B7_4$, $B7_5$, $B7_6$, $B7_7$, $B6_0$, $B6_1$, $B6_2$, $B6_3$, $B5_0$, $B5_1$ and B4 with the unary format, and filling the dummy bit "0".

The bits with the unary format are sent to the logic circuits 410-440 through the page buffer 460 of corresponding bit lines.

Figure 4B:
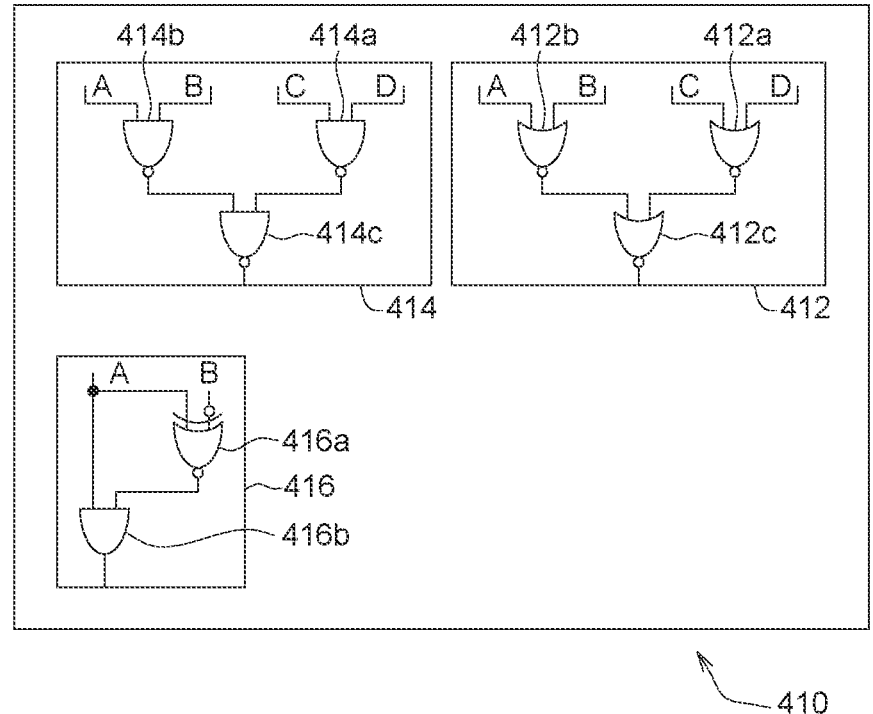
FIG. 4B is a circuit diagram of the logic circuit of the present disclosure.

Taking the logic circuit 410 as an example, the logic circuit 410 is used to perform the majority group-counting operation of the bits $B7_0$-$B7_3$. Referring to FIG. 4B illustrating a circuit diagram of the logic circuit of the present disclosure, the logic circuit 410 includes a NOR type majority processing circuit 412, a NAND type majority processing circuit 414 and a majority answer transition circuit 416. The NOR type majority processing circuit 412 includes a plurality of NOR gates 412a, 412b and 412c, the NAND type majority processing circuit 414 includes a plurality of NAND gates 414a, 414b and 414c, and the majority answer transition circuit 416 includes an XNOR gate 416a and an AND gate 416b. The above-mentioned logic gates are alternately connected to form the logic circuit 410.

Referring again to FIG. 4A, in operation, the NOR gate 412a and the NAND gate 414a receive bit B4 and dummy bit "0", and the NOR gate 412b and the NAND gate 414b receive bits $B5_0$ and $B5_1$. When the group G-M1=($B5_0$ $B5_1$ B4 0)=(1 0 1 1), the logic circuit 410 outputs the final majority group-counting result MGC1=1 through the AND gate 416b. In one example, when the bit $B5_1$ is an failed bit, the majority group-counting result MGC1 of the logic circuit 410 is not affected by the failed bit, hence the counting circuit 400 may tolerate the failed bit.

Logic circuits 420, 430 and 440 are similar to logic circuit 410. The logic circuit 420 is used to perform the majority group-counting operation of the bits $B7_4$ to $B7_7$, the logic circuit 430 is used to perform the majority group-counting operation of the bits $B6_0$ to $B6_3$, and the logic circuit 440 is used to perform the majority group-counting operation of the bits $B5_0$, $B5_1$, B4 and dummy bit "0". When ($B7_0$ $B7_1$ $B7_2$ $B7_3$ $B7_4$ $B7_5$ $B7_6$ $B7_7$ $B6_0$ $B6_1$ $B6_2$ $B6_3$ $B5_0$ $B5_1$ B4 0)=(0 1 0 0 0 0 1 1 1 1 1 0 1 0 1 1), the logic circuits 410-440 respectively generate majority counting results MGC1=1, MGC2=1, MGC3=0 and MGC4=0. Then, the results MGC1-MGC4 are accumulated through the accumulator 450, to obtain an accumulating result as 0+0+1+1=2. The accumulating result is multiplied by "2 to the power of 2", and a final majority group-counting result MGC is decimal "8".

The direct counting result C1=9 of the bits of "1" among the bits $B7_0$-$B7_7$, $B6_0$-$B6_3$, $B5_0$, $B5_1$, B4, and "0" with the unary format after expansion. Furthermore, the ideal majority group-counting result of the expanded bits $B7_0$-$B7_7$, $B6_0$-$B6_3$, $B5_0$, $B5_1$, B4, and "0" is $0*2^3+1*2^2+1*2^1+1*2^0+0=7$. The majority group-counting result MGC=8 of the counting circuit 400 has sufficient computation accuracy.

Figure 5:
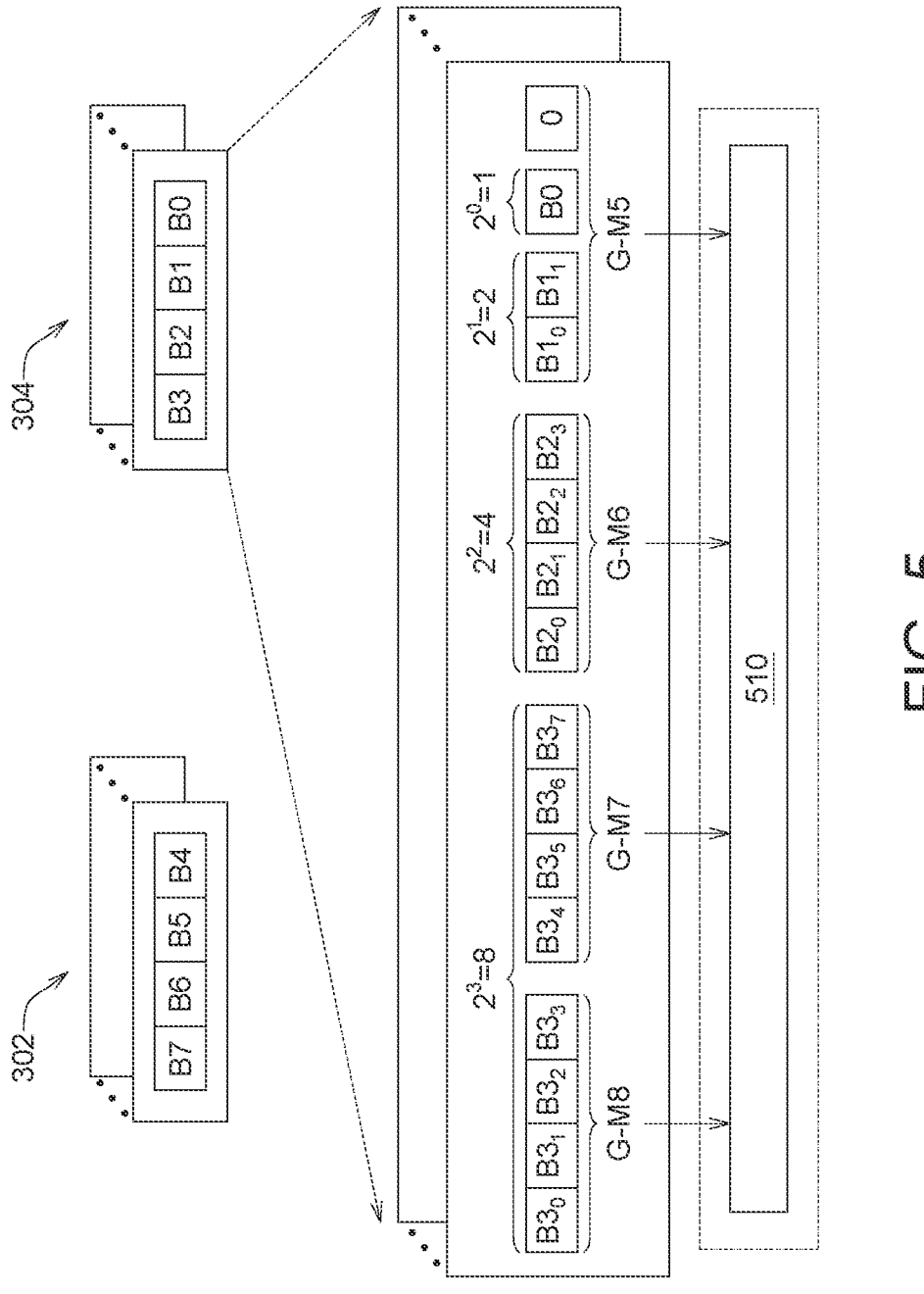
FIG. 5 is a schematic diagram of another embodiment of the group-counting operation performed by the memory device of the present disclosure.

FIG. 5 is a schematic diagram of another embodiment of the group-counting operation performed by the memory device 1000 of the present disclosure. The group-counting operation of this embodiment may be referred to as a "second group-counting operation", which may be applied to LSB vector 304 with low importance of data and stored in the low pages of the memory array 100. As shown in FIG. 5, the four bits B0-B3 with the binary format in the LSB vector 304 may be performed with value expanding to obtain bits $B3_0$-$B3_7$, $B2_0$-$B2_3$, $B1_0$, $B1_1$ and B0 with the unary format, and filling with a dummy bit "0". The above bits with unary format are grouped into groups G-M8, G-M7, G-M6 and G-M5. Each group has 4 bits. The second group-counting operation 510 may be performed to the groups G-M5 to G-M8 according to the second data amount D2. The data of the LSB vector 304 is less important and is stored in the low page, hence the second data amount D2 is a "coarse-grained" larger number of bits with which the second group-counting operation 510 is executed. For example, the second data amount D2 is 16 bits, which is larger than the first data amount D1=4 bits with which the first group-counting operations 310-340 of the MSB vector 302 is executed, shown in FIG. 3.

The normal group-counting result GC and the ideal/non-ideal majority group-counting result MGC obtained according to the second data amount D2=16 bits, are shown in the truth table of Table 4. The "coarse-grained" 16-bit majority group-counting operation shown in Table 4 may tolerate more failed bits than the "fine-grained" 4-bit majority group-counting operation shown in Table 3.

TABLE 4

| Total number of "1" bits in groups G-M5 to G-M8 | Normal group-counting result GC | Ideal majority group-counting result MGC | Non-ideal majority group-counting result MGC |
|---|---|---|---|
| 16 | 1 | 1 | 1 |
| 15 | | | |
| 14 | | | |
| 13 | | | |
| 12 | | | |
| 11 | | | |
| 10 | | | |
| 9 | | | |
| 8 | | | 0 |
| 7 | | 0 | |
| 6 | | | |
| 5 | | | |
| 4 | | | |
| 3 | | | |
| 2 | | | |
| 1 | | | |
| 0 | 0 | | |

To sum up, the embodiment of FIG. 3 refers to the first group-counting operation performed to the MSB vector 302 of the feature vector q1' based on the first data amount D1=4 bits, and the embodiment of FIG. 5 refers to the second group-counting operation performed to the LSB vector 304 of the feature vector q1' based on the second data amount D2=16 bits. In other various examples shown in Table 5, the MSB vector 302 and the LSB vector 304 may also perform group-counting operations based on the data amount with different number of bits, and may selectively employ a majority function.

TABLE 5

| MSB vector The first group-counting operation | | LSB vector The second group-counting operation | |
|---|---|---|---|
| The first data amount D1 | 4 bits | The second data amount D2 | 16 bits |
| Employ majority function? | yes | Employ majority function? | yes |
| The first data amount D1 | 4 bits | The second data amount D2 | 16 bits |
| Employ majority function? | yes | Employ majority function? | No |
| The first data amount D1 | 4 bits | The second data amount D2 | 16 bits |
| Employ majority function? | No | Employ majority-function? | No |
| The first data amount D1 | 8 bits | The second data amount D2 | 16 bits |
| Employ majority function? | yes | Employ majority function? | yes |

Figure 6:
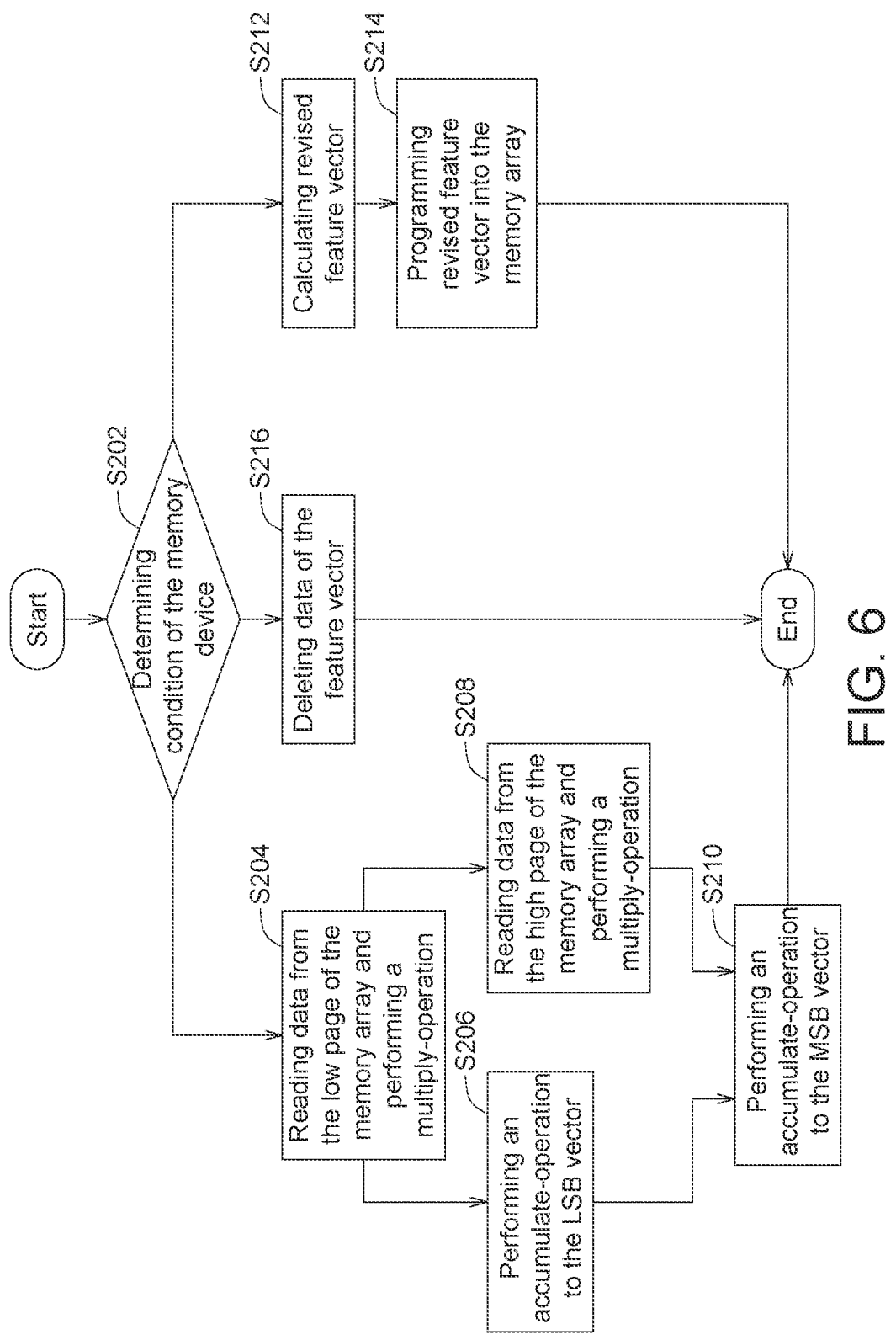
FIG. 6 is a flowchart of another embodiment of the MAC-operation performed by the memory device.

FIG. 6 is a flowchart of another embodiment of the MAC-operation performed by the memory device 1000. Referring to FIG. 6, in step S202, the condition of the memory device 1000 is determined. When it is determined that the memory device 1000 will perform the MAC-operation, then step S204 is performed: reading data from the low page of the memory array 100 and performing a multiplying-operation. For example, the selective BL read operation is performed to read the i-th weight feature vector qi from the low page of the memory array 100, and performing multiplying-operation to the weight vector data qi and the input feature vector p0 to obtain the output feature vector qi'.

Next, step S206 is performed, and a second group-counting operation is performed to the LSB vector of the output feature vector qi' of the low page, so as to perform an accumulating-operation. The second group-counting operation may be performed based on the second data amount D2=16 bits.

On the other hand, at the same time with step 206 or after step S206, step S208 may be performed: reading data from the high page of the memory array 100 and performing a multiplying-operation. For example, a selective BL read operation is performed to read the weight feature vector qi from the high page of the memory array 100, and a multiplying-operation is performed to obtain the output feature vector qi'.

Next, step S210 is performed, and a first group-counting operation is performed to the MSB vector of the output feature vector qi' in the high page, so as to perform an accumulating-operation. The first group-counting operation may be performed based on the first data amount D1=4 bits.

On the other hand, in step S202, when it is determined that the memory device 1000 will create data, insert data or update data, then proceeding to step S212: calculate the revised weight feature vector qi or input feature vector p0. Next, executing step S214: programing and writing the revised vector data into the memory array 100.

Alternatively, in step S202, when it is determined that the memory device 1000 will remove the data, then proceeding to step S216: deleting the data. For example, the N weight feature vectors q1-qN stored in the memory array 100 are deleted.

Figure 7A:
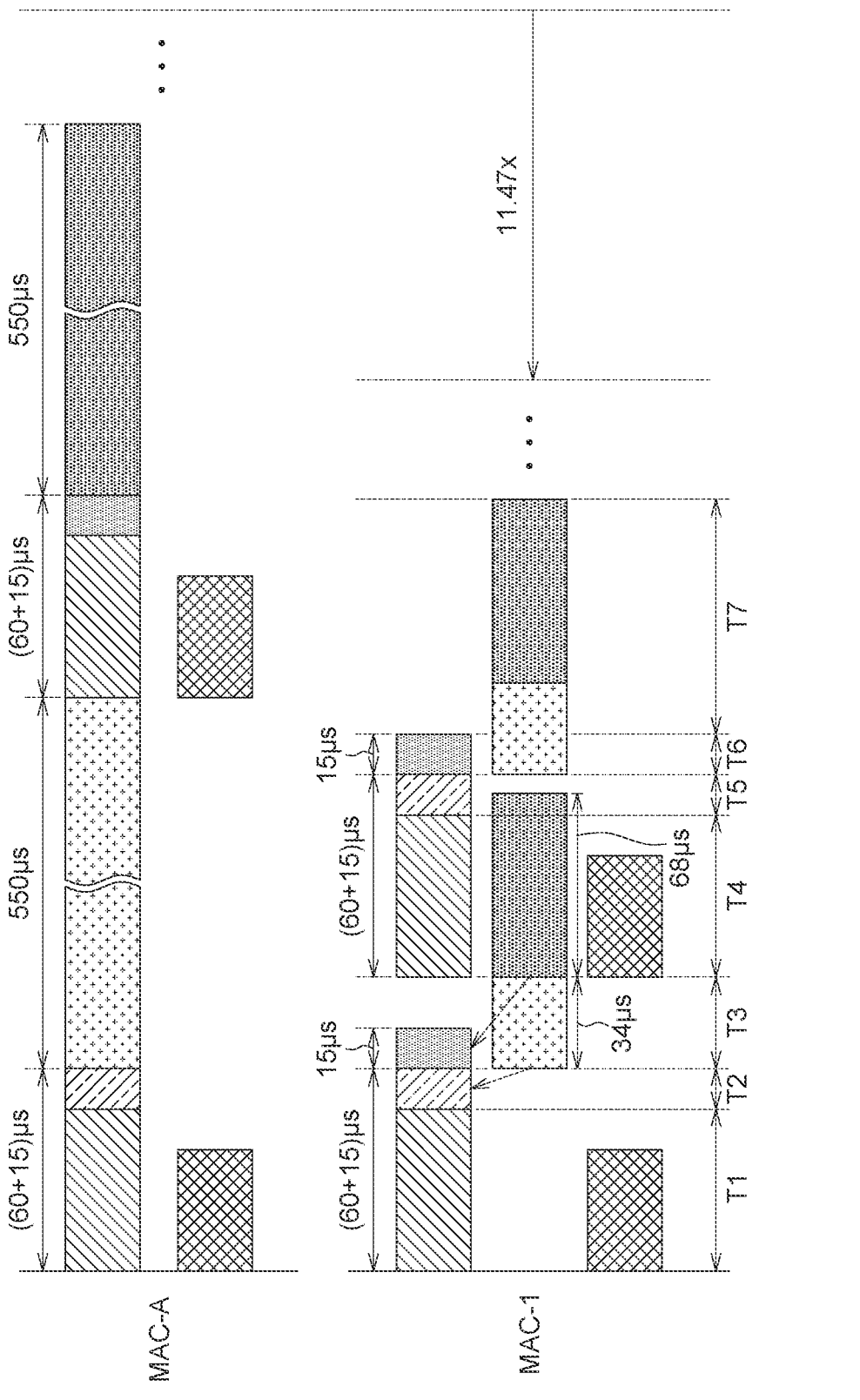
FIG. 7A is a schedule diagram of an embodiment of the MAC-operation performed by the memory device, compared to the MAC-operation of the first comparative example.

FIG. 7A is a schedule diagram of an embodiment of the MAC-operation "MAC-1" performed by the memory device 1000, compared to the MAC-operation "MAC-A" of the first comparative example. Referring to FIG. 7A, in the period T1, the setup of the first word line WL1 and the setup of the bit line of the memory array 100 are performed. The setup-time of the bit line is approximately 60 μs. In the period T2, selective BL read operation is performed to the LSB vector of the feature vector q1 stored in the low page corresponding to the word line WL1, and the reading-time corresponding to applying reading-voltage once is approximately 15 μs.

Then, in a period T3, a selective BL read operation is performed to the MSB vector of the feature vector q1 stored in the high page corresponding to the word line WL1. At the same time, the second group-counting operation is performed to the LSB vector of the feature vector q1 which is read out in the period T2 (according to the second data amount D2=16 bits), and the time for the second group-counting operation is approximately 34 μs. From the above, the second group-counting operation for the LSB vector stored in the low page storage may operate concurrently with the reading-operation of the MSB vector stored in the high page in a pipeline manner.

Then, in the period T4, the setup of the second word line WL2 and the bit line of the memory array 100 is performed. At the same time, the first group-counting operation is performed to the MSB vector of the feature vector q1 which is read out in the period T3 (according to the first data amount D1=8 bits), and the time for the second group-counting operation is approximately 68 μs. From above, the first group-counting operation of the MSB vector stored in the high page is performed concurrently with the setting of the next word line WL2 in a pipelined manner.

Then, in the period T5, a selective BL read operation is performed to the LSB vector of the next feature vector q2 stored in the low page corresponding to the word line WL2. In the period T6, a select BL read operation is performed to the MSB vector of the feature vector q2 stored in the high page corresponding to the word line WL2. At the same time, a second group-counting operation is performed on the LSB vector of the feature vector q2 which is read out in the period T5.

Then, in the period T7, a first group-counting operation is performed on the MSB vector of the feature vector q2 which is read out in the period T6.

On the other hand, in the scheduling of the MAC-operation "MAC-A" of the first comparative example, the group-counting operation of the LSB vector stored in the low page and the group-counting operation of the MSB vector stored in the high page are not simultaneously performed, hence the operation time of the MAC-operation "MAC-A" is longer. Compared with the MAC-operation "MAC-A" of the first comparative example, the MAC-operation "MAC-1" of this embodiment improves operation-time-latency by 11.47 times.

Figure 7B:
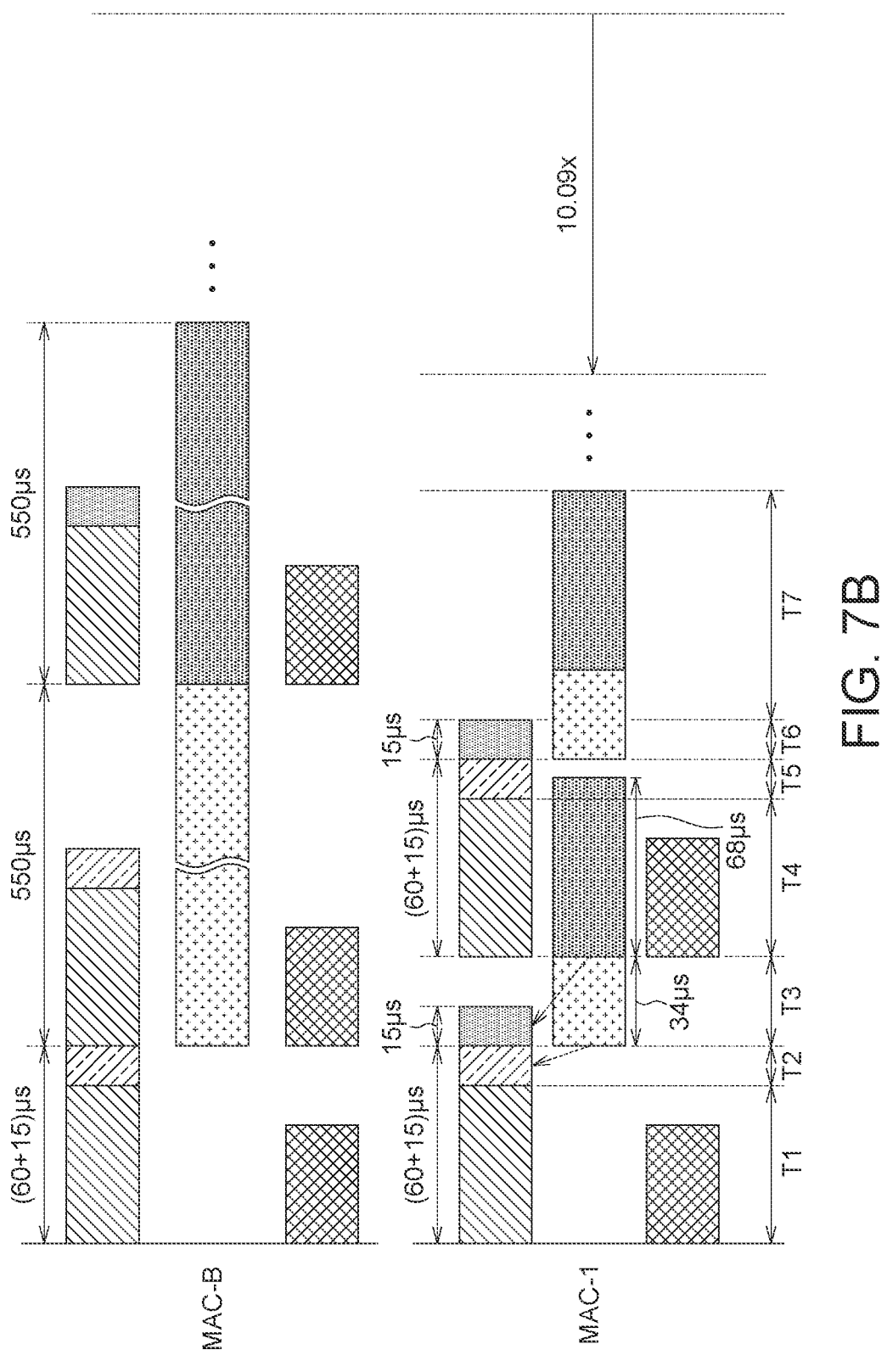
FIG. 7B is a schedule diagram of an embodiment of the MAC-operation performed by the memory device, compared to the MAC-operation of the second comparative example.

FIG. 7B is a schedule diagram of an embodiment of the MAC-operation "MAC-1" performed by the memory device 1000, compared to the MAC-operation "MAC-B" of the second comparative example. Referring to FIG. 7B, in the MAC-operation "MAC-B" of the second comparative example, the group-counting operation of the LSB vector stored in the low page is performed concurrently with the setting of the bit line and the word line WL2 in a pipeline manner, and the group-counting operation of the MSB vector stored in the high page is performed concurrently with the setting of the bit line and the word line WL3 in a pipeline manner, hence the operation time of the MAC-operation "MAC-B" of the second comparative example may be reduced. However, regarding the operation-time-latency, of the MAC-operation "MAC-1" of the memory device 1000 of the present disclosure is still better than the MAC-operation "MAC-B" of the second comparative example, by about 10.09 times.

Figure 7C:
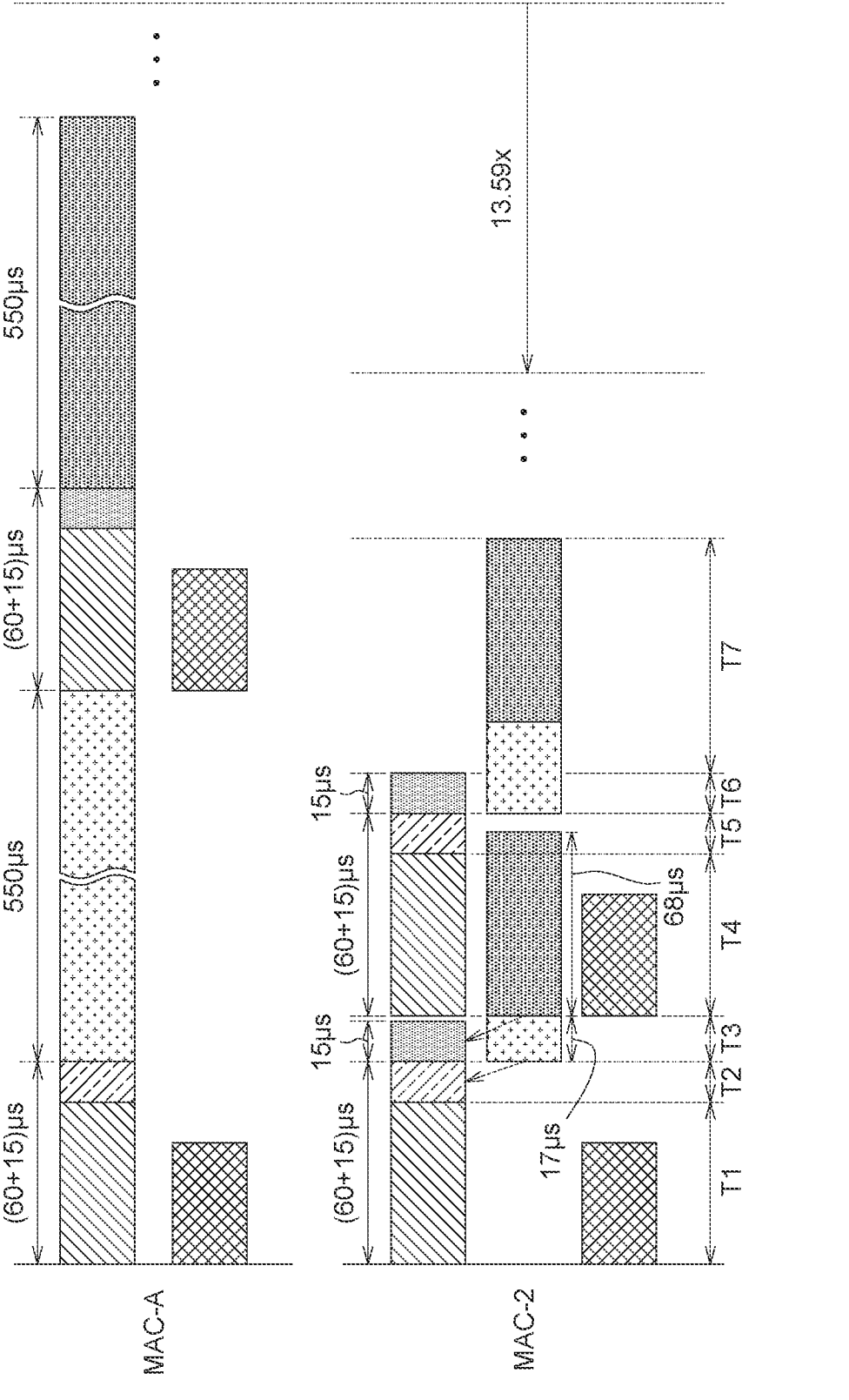
FIG. 7C is a schedule diagram of another embodiment of the MAC-operation performed by the memory device, compared to the MAC-operation of the first comparative example.
Figure 7D:
FIG. 7D is a schedule diagram of another embodiment of the MAC-operation performed by the memory device, compared to the MAC-operation of the second comparative example.

FIG. 7C is a schedule diagram of another embodiment of the MAC-operation "MAC-2" performed by the memory device 1000, compared to the MAC-operation "MAC-A" of the first comparative example. FIG. 7D is a schedule diagram of another embodiment of the MAC-operation "MAC-2" performed by the memory device 1000, compared to the MAC-operation "MAC-B" of the second comparative example. In the MAC-operation "MAC-2" of this embodiment, the first group-counting operation for the MSB vector stored in the high page is performed based on the "fine grained" number of bits (based on the first data amount D1=4 bits).

Regarding operation-time-latency, the MAC-operation "MAC-2" of the memory device 1000 of the present disclosure is about 13.59 times better than the MAC-operation "MAC-A" of the first comparative example, and is about 11.96 times better than the MAC-operation "MAC-B" of the second comparative example.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:

a memory array, for storing a plurality of vector data, each vector data has an MSB vector and a LSB vector, and the memory array comprises:

a plurality of memory units, each memory unit has a first bit and a second bit, the first bit is used to store the MSB vector of each vector data, and the second bit is used to store the LSB vector of each vector data; and a counting circuit, comprising a plurality of logic circuits and an accumulator and used for executing a first group-counting operation according to a first data amount and executing a second group-counting operation according to a second data amount based on a majority function, wherein, each vector data is processed with a multiplying-operation, the MSB vector of each vector data is processed with the first group-counting operation, the LSB vector of each vector data is processed with the second group-counting operation, and the threshold voltage distribution of each memory unit is divided into N states, N is a positive integer and N is less than 2 to the power of 2, and the effective bit number stored by each memory unit is less than 2.

2. The memory device according to claim 1, wherein a physical page of the memory array has a plurality of logic pages, the logic pages include a high page and a low page, the high page corresponds to the first bit to store the MSB vector, the low page corresponds to the second bit to store the LSB vector.

3. The memory device according to claim 1, wherein the vector data include a plurality of weight feature vectors and an input feature vector, the memory array stores the weight feature vectors and receives the input feature vector, and executes the multiplying-operation according to the input feature vector and one of the weight feature vectors.

4. The memory device according to claim 3, wherein the counting circuit executes an accumulating-operation according to a result of the multiplying-operation and executes the first group-counting operation for the MSB vector of the input feature vector and the weight feature vectors.

5. The memory device according to claim 4, wherein the counting circuit executes the second group-counting operation for the LSB vector of the input feature vector and the weight feature vectors, and the second group-counting operation is executed according to a second data amount, the bit number of the second data amount is greater than the bit number of the first data amount.

6. The memory device according to claim 5, wherein the memory array reads the MSB vector and the LSB vector of the weight feature vectors according to a selective bit line read operation;

wherein, the selective bit line read operation for the MSB vector of the weight feature vectors is executed concurrently with the second group-counting operation for the LSB vector of the weight feature vectors.

7. The memory device according to claim 6, wherein a bit-line-setup for the selective bit line read operation is executed concurrently with the first group-counting operation for the MSB vector of the weight feature vectors.

8. An operating method of a memory device, wherein the memory device includes a memory array, the memory array includes a plurality of memory units, each memory unit has a first bit and a second bit, the operating method comprising:

storing a plurality of vector data in the memory array, each vector data has an MSB vector and a LSB vector;

storing the MSB vector of each vector data in the first bit; and storing the LSB vector of each vector data in the second bit;

executing a multiplying-operation for each vector data;

executing a first group-counting operation for the MSB vector of each vector data; and executing a second group-counting operation for the LSB vector of each vector data;

wherein, a threshold voltage distribution of each memory unit is divided into N states, N is a positive integer and N is less than 2 to the power of 2, and the effective bit number stored by each memory unit is less than 2.

9. The operating method according to claim 8, wherein a physical page of the memory array has a plurality of logic pages, the logic pages include a high page and a low page, the high page corresponds to the first bit to store the MSB vector, the low page corresponds to the second bit to store the LSB vector.

10. The operating method according to claim 8, wherein the vector data include a plurality of weight feature vectors and an input feature vector, the operating method further comprises:

storing the weight feature vectors in the memory array;

receiving the input feature vector, and executing the multiplying-operation according to the input feature vector and one of the weight feature vectors.

11. The operating method according to claim 10, further comprising:

executing an accumulating-operation according to a result of the multiplying-operation;

wherein, the MSB vector of the input feature vector and the weight feature vectors is executed with the first group-counting operation to perform the accumulating-operation, and the first group-counting operation is executed according to a first data amount.

12. The operating method according to claim 11, further comprising:

executing the second group-counting operation for the LSB vector of the input feature vector and the weight feature vectors to perform the accumulating-operation, and the second group-counting operation is executed according to a second data amount, the bit number of the second data amount is greater than the bit number of the first data amount.

13. The operating method according to claim 12, wherein the first group-counting operation and the second group-counting operation are executed selectively using a majority function.

14. The operating method according to claim 12, further comprising:

executing a selective bit line read operation to read the MSB vector and the LSB vector of the weight feature vectors;

wherein, the selective bit line read operation for the MSB vector of the weight feature vectors is executed concurrently with the second group-counting operation for the LSB vector of the weight feature vectors.

15. The operating method according to claim 14, wherein a bit-line-setup for the selective bit line read operation is executed concurrently with the first group-counting operation for the MSB vector of the weight feature vectors.

* * * * *